United States Patent [19]
Chung et al.

[11] Patent Number: 6,160,742
[45] Date of Patent: Dec. 12, 2000

[54] SEMICONDUCTOR MEMORY DEVICE AND DATA READ METHOD OF DEVICE

[75] Inventors: Min-Chul Chung, Ansan; Kyeong-Rae Kim, Seoul, both of Rep. of Korea

[73] Assignee: Samsung Electronics, Co., Ltd., Suwon, Rep. of Korea

[21] Appl. No.: 09/353,106

[22] Filed: Jul. 14, 1999

[30] Foreign Application Priority Data

Jul. 14, 1998 [KR] Rep. of Korea ....................... 98-28352

[51] Int. Cl.[7] .................................................. G11C 7/00
[52] U.S. Cl. ............................... 365/189.05; 365/189.11; 365/205
[58] Field of Search .......................... 365/189.05, 189.11, 365/205

[56] References Cited

U.S. PATENT DOCUMENTS

| | | | |
|---|---|---|---|
| 5,389,213 | 2/1995 | Yeon et al. | 365/189.05 X |
| 5,530,955 | 6/1996 | Kaneko | 365/189.05 X |
| 5,777,938 | 7/1998 | Nakamura et al. | 365/198.11 X |
| 5,877,990 | 3/1999 | Kim | 365/189.05 |
| 5,949,721 | 9/1999 | Kwon et al. | 365/189.11 |

*Primary Examiner*—Huan Hoang
*Attorney, Agent, or Firm*—Marger Johnson & McCollom, P.C.

[57] ABSTRACT

The semiconductor memory device includes a memory cell array, sense amplifying means for generating a sense output signal pair, and a data output buffer for providing the sense output signal pair. The data output buffer includes a level shifter for generating a first data output signal pair by shifting the level of the sense output signal pair responsive to the output buffer enable signal. A register inverts and latches the first data output signal pair, generating a second data output signal pair. A first transmission and latch means transmits and latches the second data output signal pair generating a third data output signal pair responsive to a first control signal. A second transmission and latch means transmits and latches the second data output signal pair generating a fourth data output signal pair responsive to a second control signal. A first inverter generates a fifth data output signal pair by inverting the third data output signal pair responsive to a first data output control signal. A second inverter generates the fifth data output signal pair by inverting the fourth data output signal pair responsive to a second data output control signal. A first latch generates a sixth data output signal pair by latching the fifth data output signal pair. A logical multiplication means manipulates the sixth data output signal pair responsive to an output enable signal.

33 Claims, 13 Drawing Sheets

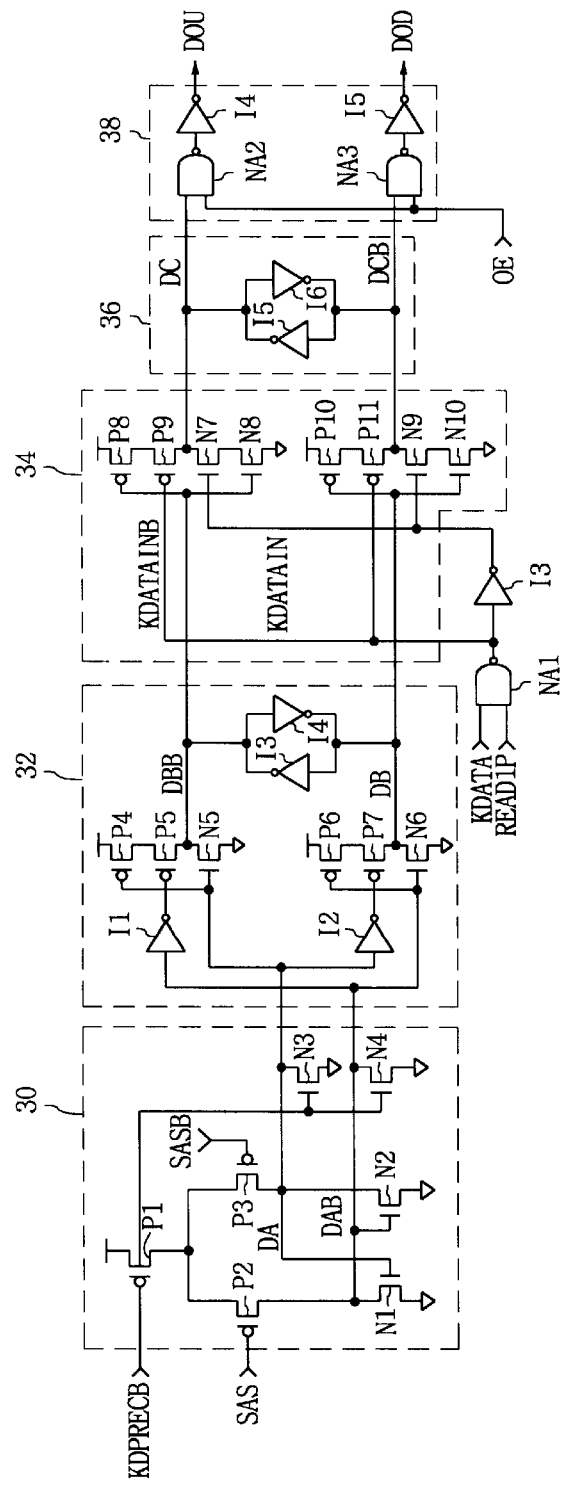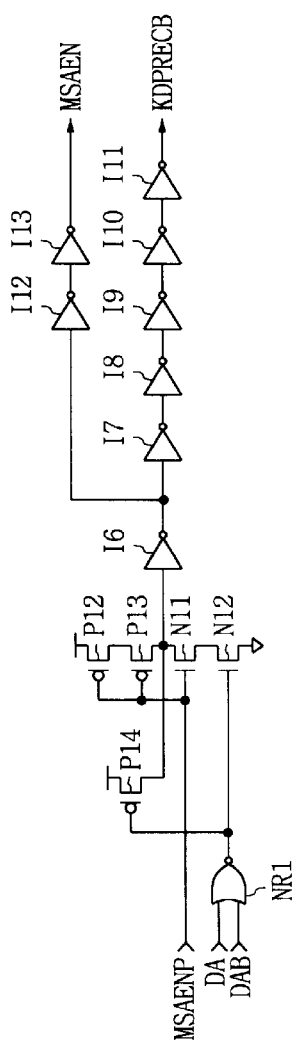
FIG. 3a (PRIOR ART)
FIG. 3b (PRIOR ART)

SEMICONDUCTOR MEMORY DEVICE AND DATA READ METHOD OF DEVICE

BACKGROUND OF THE INVENTION

1. Field of the Invention

The present invention relates to a semiconductor memory device and data read method thereof capable of performing a 2 cycle pipelined operation without errors.

2. Description of the Prior Art

A synchronous type semiconductor memory device performs read and write operations responsive to an external clock signal. One disadvantage to this type of device is the amount of time it takes for the semiconductor memory device to respond to a read address and transmit the read data stored in the cell to a data output buffer through a bit line pair, a data line pair, and a sense amplifier. Therefore, if the frequency of the clock signal becomes shorter than the time for the read data to be transmitted to the data output buffer, the read data will not be output to the external device.

The pipeline method of reading data was designed to solve this problem. The pipelined method responds to the read command and outputs the read data transmitted from a memory cell to the data output buffer out to the external device after one cycle of the read command. However, the operational advantages of using the conventional pipelined read method are limited as semiconductor memory devices operate at high frequencies.

The present invention presents a method for performing a 2 cycles read latency operation where the conventional pipelined method is considered as a 1 cycle read latency operation. In other words, the 2 cycles pipelined method of the present invention responds to the read command and outputs the read data transmitted from the memory cell to the data output buffer out to the external device after 2 cycles of the read command. One question is whether this method can be performed without errors using a conventional data output buffer. In result, if the clock signal has a high frequency, the conventional data output buffer can perform the 2 cycles pipelined operation. If the frequency of the clock signal is low, it cannot perform the 2 cycles pipelined operation.

FIG. 1 is a block diagram of a data read method for a conventional semiconductor memory device. The device is comprised of memory cells 10-1, 10-2, . . . , 10-n, free charging and equalizing circuits 12-1, 12-2, . . . , 12-n, a row address decoder 14, column selecting switches 16-1, 16-2, . . . , 16-n, a column address decoder 18, a sense amplifier 20, and a data output buffer 22.

The memory cells 10-1, 10-2, . . . , 10-n are selected by a word line selection signal. The free charging and equalizing circuits 12-1, 12-2, . . . , 12-n free-charge and equalize bit line pairs BL1 and BLB 1, BL2 and BLB2, . . . , Bln and BLBn during the execution of the read operation. The row address decoder 14 decodes a row address X and generates word line selection signals WL1, WL2, . . . , WLn. The column address decoder 18 decodes a column address Y and generates column selection signals Y1, Y2, . . . , Yn. The column selection switches 16-1, 16-2, . . . , 16-n respectively respond to the column selection signals Y1, Y2, . . . , Yn and transmit the data from the selected bit line pair to the pertinent data line pairs DLk and DLBk. The sense amplifier 20 is enabled during the execution of the read command, detects and amplifies the difference in data transmitted to the data line pair DLk and DLBk, and generates the sense output signal pair SASk and SASBk. The data output buffer 22 is input to the sense output signal pair SASk and SASBk, buffers it and generates data output signal pair DOUk and DODk.

FIG. 2 is a block diagram of the data output buffer 22 shown in FIG. 1. The data output buffer 22 comprises a level shifter 30, register 32, an inverter 34, a latch 36, and logical multiplication means 38. The level shifter 30 receives the sense output signal pair SAS and SASB, shifts their level and generates data output signal pair DA and DAB. The register 32 generates the data output signal pair DB and DBB by the data output signal pair DA and DAB. The inverter 34 inverts the data signal pair DB and DBB responsive to a signal KDATAIN and outputs it as data output signal pair DC and DCB. The latch 36 latches the data output signal pair DC and DCB. The logical multiplication means 38 outputs the data output signal pair DC and DCB as data output signal pair DOU and DOD responsive to an output enable control signal OE.

FIG. 3a is a circuit of the data output buffer 22 shown in FIGS. 1 and 2. The level shifter 30 is comprised of PMOS transistors P1, P2, and P3 and NMOS transistors N1, N2, N3, and N4. The register 32 is comprised of inverters I1, I2, I3, and I4, PMOS transistors P4, P5, P6, and P7 and NMOS transistors N5 and N6. The inverter 34 is comprised of PMOS transistors P8, P9, P10, and P11 and NMOS transistors N7, N8, N9, and N10. The circuit for generating a data input control signal KDATAIN includes a NAND gate NAI and an inverter I3. The latch 36 is comprised of inverters I5 and I6. The logical multiplication means 38 is comprised of NAND gates NA2 and NA3 and inverters I3 and I5.

Once a read command is received, a control signal KDPRECB changes to a low level enabling the level shifter 30. The level shifter 30 detects the difference in voltage in the sense amplifier output signal pair SAS and SASB and outputs the data output signal pair DA and DAB. If the sense amplifier output signal SAS has a higher voltage than the reverse sense amplifier output signal SASB, the PMOS transistor P3 than the PMOS transistor P2. The data output signal DA changes to a high level and the inverse data output signal DAB changes to a low level. Alternatively, if the sense amplifier output signal SAS has a lower er voltage than the inverse sense amplifier output signal SASB, the data output signal DA changes to a low level and the inverse data output signal DAB changes to a high level.

The register 32 inverts the data output signal pair DA and DAB respectively by the inverters I2 and I1. If one single line of the data output signal pair DA and DAB is high and the other low, the output signal of the inverter I2 is at a low level and the output signal of the inverter I1 is at a high level. Then, the NMOS transistor N5 and the PMOS transistors P6 and P7 are turned on and the data output signal pair DBB and DB is respectively at a high and low level. On the other hand, if the data output signal pair DA and DAB is respectively low and high, the data output signal pair DBB and DB respectively changes to a high and low level. The data transmitted as the data output signal pair DBB and DB is stored in the latch I3 and I4. In other words, the register 32 transmits the data of the data output signal pair DA and DAB as the data output signal pair DBB and DB and latches it.

The inverter 34 is enabled responsive to a data output control signal KDATAIN resulting from the logical multiplication of a signal KDATA and READ1P. The signal KDATA is enabled by and synchronized with the clock signal every cycle. The signal READ1P is enabled after one cycle of the read command. In other words, when the data output control signal KDATAIN is at a low level, the PMOS transistors P9 and P11 and the NMOS transistors N7 and N9 are turned off, and the transmission of the data from the data output signal pair DBB and DB to the data output control signal pair DC and DCB is prevented. Alternatively, if the data output control signal KDATAIN is at a high level, the PMOS transistors P9 and P11 and the NMOS transistors N7 and N9 are turned on, respectively, inverting data from the data output signal pair DBB and DB and transmitting the data as the data output signal pair DC and DCB. The construction of the inverter 34 is that of a clocked CMOS inverter that inverts the data output signal pair DBB and DB and outputs it as the data output signal pair DC and DCB respectively. The latch 36 latches the data of the data output signal pair DC and DCB. The logical multiplication means 38 outputs the data output signal pair DC and DCB as the data output signal pair DOU and DOD responsive to the data output enable signal OE.

The conventional data output buffer as described above reads data from the appropriate memory cell and latches the data in the latch of the register 32 responsive to the read command. The data in the latch of register 32 is enabled after 1 cycle responsive to the output control signal KDATAIN and is transmitted to the latch 36 through the inverter 34. The data is then provided to an external device (not shown) responsive to the data output enable signal OE. Therefore, execution of the 1 cycle pipelined operation is possible in the conventional data output buffer such as output buffer 22.

FIG. 3b is a circuit diagram of the control signal generating circuit for enabling the sense amplifier 20 and the data output buffer 22. The circuit is comprised of a NOR gate NR1, PMOS transistors P12, P13, and P14, NMOS transistors N11 and N12, and inverters I6, I7, I8, I9, I10, I11, I12, and I13. Once a read command is received, a sense amplifier control signal MSAENP is enabled by a high level pulse and the data output signal pair DA and DAB changes to a low level. The output signal of the NOR gate NR1 changes to a high level and the NMOS transistors N11 and N12 are all turned on providing a low level signal to the drain terminal of the NMOS transistor N11. The inverters I6–I11 delay the low level signal changing the data output buffer control signal KDPRECB to a low level. The inverters I6, I12, and I13 invert and delay the low level signal of low level changing the sense amplifier enable signal MSAEN to a high level. The sense amplifier is enabled responsive to a high level sense amplifier enable signal MSAEN. Referring to FIGS. 4a and 4b, a 2 cycles pipelined operation of the data output buffer shown in FIG. 3a responsive to a low and high frequency clock signal is described.

In the 2 cycles pipeline method, the data output buffer 22 shown in FIG. 3a is enabled by the control signal READ2P instead of by the control signal READ1P. The control signal READ1P is enabled after 1 cycle of the read command. In contrast, the control signal READ2P is enabled after 2 cycles of the read command. FIGS. 4a and 4b show the execution of the 2 cycles pipelined operation after the control signal READ2P is applied. FIG. 4a is a timing diagram of the 2 cycles pipelined operation of the data output buffer 22 shown in FIG. 3a where a frequency clock signal is applied.

In FIG. 4a, the cycle time of the clock signal is approximately 10ns. Of these, 5–6ns (this is almost a fixed amount of time) are used to read data after the read command is received. The control signal KDATA is enabled responsive to a clock signal XCK during the execution of the read command. The control signal READ2P is enabled 2 cycles after the read command, as described above. The control signal READ2P is enabled in the third cycle III because the read command is received at the first cycle I of the timing diagram shown in FIG. 4a. The data output control signal KDATAIN is generated when the control signals KDATA and READ2P are logically multiplied. The data output control signal KDATAIN is synchronized with the control signal KDATA from the third cycle III.

In the first cycle I, the read data D1 pertinent to the first read command is latched in the register 32 after 5–6ns (hereinafter a predetermined time). In the second cycle II, the read data D2 pertinent to the second read command is latched into the register 32 after the predetermined time. Therefore, the read data D1 that was previously latched in the register 32 in the first cycle I may be lost.

In the third cycle III, the read data D2 that is stored in the latch of the register 32 is latched in the latch 36 through the inverter 34 responsive to the data output control signal KDATAIN. The read data D2 is then provided to external circuitry (not shown) as data Q2 through the logical multiplication means 38 responsive to the output enable signal OE. The read data D3 corresponding to the third read command is latched into the register 32 after lapse of the predetermined time. Despite that the read data D1 is output as data Q1 in the third cycle, the read data D2 is output as data Q2 due to the loss of the read data D1. Therefore, the first cycle error continues to affect the read cycle, keeping the 2 cycles pipelined read operation from performing precisely. In other words, the conventional data output buffer cannot perform the 2 cycles pipelined operation where the clock signal has a frequency.

FIG. 4b is a timing diagram of the 2 cycles pipelined operation of the data output buffer 22 shown in FIG. 3a where a high frequency clock signal is applied. In FIG. 4b, the cycle time of the clock signal is approximately 3ns. Of these, 5–6ns (this is almost a fixed amount of time) are used to read data after the read command is received. This is a 5–6ns period will be referred to as a predetermined time. The control signals are generated in a similar manner as are described with reference to FIG. 4a.

In the first cycle I, the read data D1 corresponding to the first read command is read. In the second cycle II, the read data D2 corresponding to the second read command is read and the read data D1 is transferred into the data output buffer after the lapse of the predetermined time. In the third cycle III, the read data D3 corresponding to the third read command is read and the read data D1 is latched into register 32. The read data D1 is then latched into the latch 36 through the inverter 34 responsive to control signal KDATAIN. The latched data D1 is then provided to external circuitry (not shown) as data Q1 through the logical multiplication means 38 responsive to data output enable signal OE. Then, the read data D2 is inputted into the data output buffer after lapse of the predetermined time.

In the fourth cycle, the read data D4 pertinent to the fourth read command is read and the read data D2 is latched into the register 32. The read data D2 is provided to external circuitry (not shown) as data Q2 responsive to the control signal KDATAIN. Then, the read data D3 is inputted into the data output buffer after the predetermined time. In a continuous read cycle, the 2 cycles pipelined read operation is performed without errors. Thus, the conventional data output buffer is able to perform the 2 cycles pipelined operation when the clock signal has a high frequency.

Consequently, the conventional data output buffer is able to perform the 2 cycles pipelined operation properly when the clock signal has a high frequency. However, where a low frequency clock signal is used, the data output buffer can not perform the 2 cycles pipelined operation properly. Even though the 2 cycles pipelined operation is used primarily for enabling high frequency operation, the 2 cycles pipelined operation should function error free where a low frequency signal is applied. Therefore, the conventional data output buffer cannot be said to have the construction necessary for executing the 2 cycles pipelined operation.

FIG. 5 is a block diagram of an improved data output buffer. The improved data output buffer comprises a level shifter 40, a register 42, a transmission gate 44, latches 46 and 50, an inverter 48, and logical multiplication means 52. The improved data output buffer shown in FIG. 5 latches the data in the latch 46 after transmitting the data through transmission gate 44 responsive to the control signal KDATAIN1. The improved buffer circuit latches the data in the latch 50 after inverting it in inverter 48 responsive to the control signal KDATAIN2. The control signals KDATAIN1 and KDATAIN2 are enabled 1 and 2 cycles after the read command is received.

The construction and function of the level shifter 40, the register 42, the inverter 48, the latch 50, and the logical multiplication means 52 are similar to level shifter 30, register 32, inverter 34, latch 36, and logical multiplication means 38 explained before with reference to FIG. 2. The transmission gate 44 transmits the data output signal pair DBB and DB latched in the register 42 responsive to the data output control signal KDATAIN1. The latch 46 latches the data output signal pair DC and DCB transmitted through the transmission gate 44.

FIG. 6 is a detailed circuit diagram of the improved data output buffer shown in FIG. 5. The circuit is comprised of the level shifter 40, the register 42, the transmission gate 44, the latch 46, the inverter 48, the latch 50, and the logical multiplication means 52. As mentioned above, the construction and function of the level shifter 40, the register 42, the inverter 48, the latch 50, and the logical multiplication means 52 are the same as the level shifter 30, the register 32, the inverter 34, the latch 36, and the logical multiplication means 38 shown are the same as in FIG. 3. The transmission gate 44 is comprised of the transmission gates T1 and T2 and the latch 46 of the inverters I14 and I15.

The inverter 48 inverts the data output signal pair DCB and DC and transmits it as the data output signal pair DD and DDB responsive to the second data output control signal KDATAIN2. Thus, rather than the NAND gate NA1 and the inverter I3 logically multiplying the control signals KDATA and READ1P and generating the first data output control signal KDATAIN1, the NAND gate NA1 and the inverter I3 logically multiply the control signals KDATA and READ2P and generate the second data output control signal KDATAIN2.

The transmission gate 44 transmits the data output control signal pair DBB and DB latched in the register 42 as the data output signal pair DCB and DC responsive to the first data output control signal KDATAIN1. The latch 46 latches the data output control signal pair DCB and DC provided from the transmission gate 44. In other words, the transmission gate 44 and the latch 46, delay the data latched in the register 42 by 1 cycle responsive to the first data output control signal KDATAIN1.

The enable signal generating circuit for enabling the sense amplifier and the data output buffer is similar to the circuit described with reference to FIG. 3b.

FIG. 7a is a timing diagram of the 2 cycles pipelined operation of the data output buffer shown in FIG. 5a where a low frequency clock signal is applied.

In FIG. 7a, the cycle time of the clock signal is approximately 10ns. Of these, it takes 5–6ns (this is almost a fixed amount of time) for the read data to be latched in the latch of the register 42 after the read command is received.

The control signal KDATA is enabled responsive to the clock signal XCK during the execution of the read command. The control signal READ1P is enabled 1 cycle after the read command is received and the control signal READ2P is enabled 2 cycles after the read command is received, as described above. In the timing diagram shown in FIG. 7a, only the read command is continuously inputted. The control signal READ1P is always enabled in the second cycle II. The control signal READ2P is always enabled in the third cycle III. The first data output control signal KDATAIN1 is generated after the control signals KDATA and READ1P are logically multiplied. The control signal KDATAIN1 is synchronized with the control signal KDATA in the third cycle III. The data output buffer is enabled responsive to the controls signals described above.

In the first cycle I, the read data corresponding to the first read command is latched in the register 42 of the data output buffer after 5–6ns (to be used from be as an exemplary predetermined time). In the second cycle II, the read data D1 is latched in the latch 46 through the transmission gate 44 responsive to the first data output control signal. Then, the read data D2 corresponding to the second read command is latched in the register 42 of the data output buffer after lapse of the predetermined time. In the third cycle III, the read data D1 is latched in the latch 50 through the inverter 48 responsive to the second data output control signal KDATAIN2. The read data D1 is then provided to external circuitry through the logical multiplication means 52 responsive to the data output enable signal OE. The read data D2 is latched in the latch 46 through the transmission gate 44 responsive to the first data output control signal KDATAIN1. Then, the read data D3 corresponding to the third read command is latched in the register 42 of the data output buffer.

In the fourth cycle IV, the read data D2 provided to external circuitry responsive to the second data output control signal KDATAIN2. The read data D3 is latched in the latch 46 responsive to the first data output control signal KDATAIN1. The read data D4 corresponding to the fourth read command is latched in the register 42 of the data output buffer. Therefore, the circuit in FIG. 6 can precisely perform the 2 cycles pipelined operation in the continuous read cycle where a low frequency clock signal is applied.

FIG. 7b is a timing diagram of the 2 cycles pipelined operation of the data output buffer shown in FIG. 6 where a high frequency clock signal is applied.

In FIG. 7b, the cycle time of the clock signal is approximately 3ns. Of these, it takes 5–6ns (this is almost a fixed amount of time) for the read data to be latched into the latch of the register 42 after the read command is received.

In the first cycle I, the read data D1 corresponding to the first read command is read. In the second cycle II, the read data D2 corresponding to the second read command is read and the read data D1 is provided to the data output buffer after the predetermined time. In the third cycle III, the read data D3 corresponding to the third read command is read, and the read data D1 is latched in the register 42 of the data output buffer. The read data D2 is provided to the data output buffer. In the fourth cycle, the read data D4 corresponding to the fourth read command is read. The read data D2 is then latched in the register 32 of the data output buffer. The read data D1 is latched in the latch through the transmission gate 44 responsive to the control signal KDATAIN1. The read data D1 is then latched in the latch 50 through the inverter 48 responsive to the second data output control signal KDATAIN2. The read data D1 is outputted to external circuitry as output data Q1 through the logical multiplication means 52 responsive to the data output enable signal OE. The read data D2 is latched in the register 42 of the data output buffer.

If the data output buffer shown in FIG. 6 were functioning properly, it should output the read data D1 in the third cycle III. However, the data output buffer makes the error of outputting the read data D1 in the fourth cycle IV instead. Therefore, it cannot precisely perform the 2 cycles pipelined operation in the continuous read cycle. As described above, the data output buffer shown in FIG. 6 is able to perform the 2 cycles pipelined read operation where a frequency clock signal is applied, but makes errors when a high frequency clock signal is applied.

Accordingly, a need remains for a semiconductor memory device having a data output buffer capable of performing the 2 cycles read operation in both low and high frequencies.

SUMMARY OF THE INVENTION

An object of the present invention is to overcome the problems associated with prior art semiconductor memory devices.

Another object of the present invention is to provide a semiconductor memory device capable of performing an error free 2 cycles pipelined read operation responsive to both low and high frequency clock signals.

Yet another object of the present invention is to provide a data read method for a semiconductor memory device.

To achieve the above object, the present invention provides a semiconductor memory device comprising a memory cell array, sense amplifying means for generating a sense output signal pair by amplifying the data read from the memory cell array after responding to a sense amplifier enable signal, and a data output buffer. The data output buffer includes: storing means for generating and storing a first data by inputting the sense output signal; first transmission and storing means for transmitting and storing the first data stored in the storing means as a second data by responding the first control signal; second transmission and storing means for transmitting and storing the first data stored in the storing means as a third data by responding the first control signal; selecting and storing means for transmitting the second data as a fourth data by responding a first data output control signal or for transmitting the third data as the fourth data by responding a second data output control signal.

Furthermore, the present invention provides a data read method comprising the steps of: generating and storing a first data by inputting the sense output signal; transmitting and storing the first data as a second data by responding a first control signal, transmitting and storing the first data as a third data by responding a second control signal; and transmitting the second data as a fourth data by responding a first data output control signal, generating the third data as the fourth data by responding a second data output control signal.

The first control signal generates a first signal triggering by responding the sense amplifier enable signal, generates a second signal by reversing and delaying the first signal, is generated by multiplying the first signal and the second signal. The second signal is generated by non-logically adding the first signal and the second signal. The first data output control signal generates a fifth signal by multiplying the third signal generated by synchronized with the clock signal during the execution of the read command and the fourth signal enabled after 2 cycle from the read command, generates a sixth signal triggered by responding the fifth signal, and is generated by multiplying the fifth signal and the reversed sixth signal. The second data output control signal is generated by logically multiplying the fifth signal and the sixth signal.

BRIEF DESCRIPTION OF THE DRAWINGS

FIG. 3a is a detailed circuit diagram of the data output buffer shown in FIG. 1.

FIG. 3b is a circuit diagram of the control signal generating circuit for enabling the sense amplifier and the data output buffer.

DETAILED DESCRIPTION OF THE PREFERRED EMBODIMENT

Figure 1:
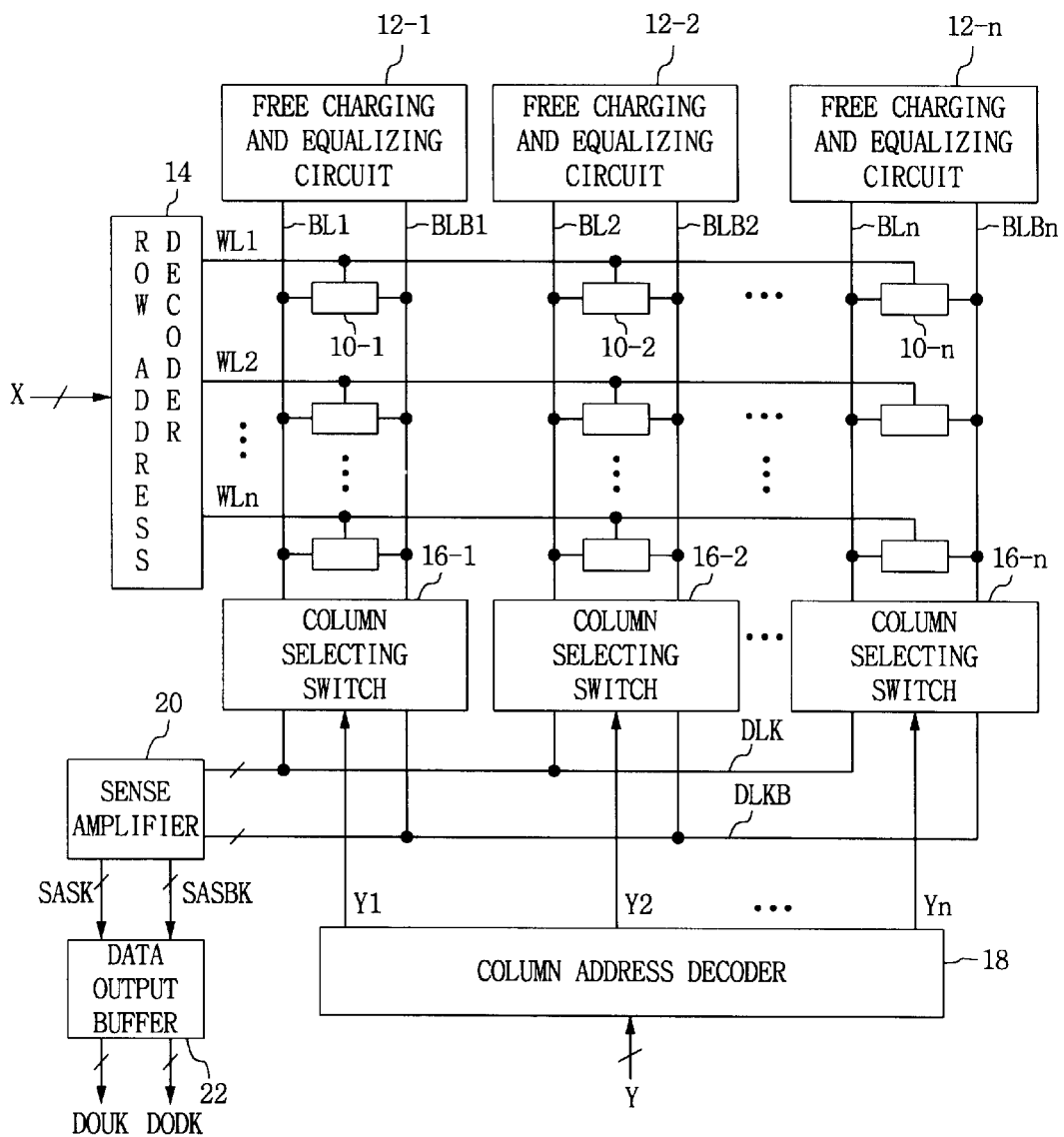
FIG. 1 is a block diagram of a conventional data read method for a semiconductor memory device.
Figure 2:
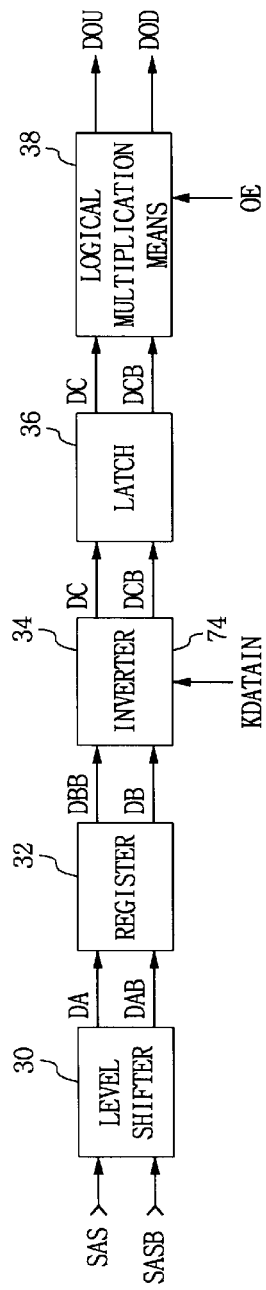
FIG. 2 is a circuit diagram of the data output buffer shown in FIG. 1.
Figure 5:
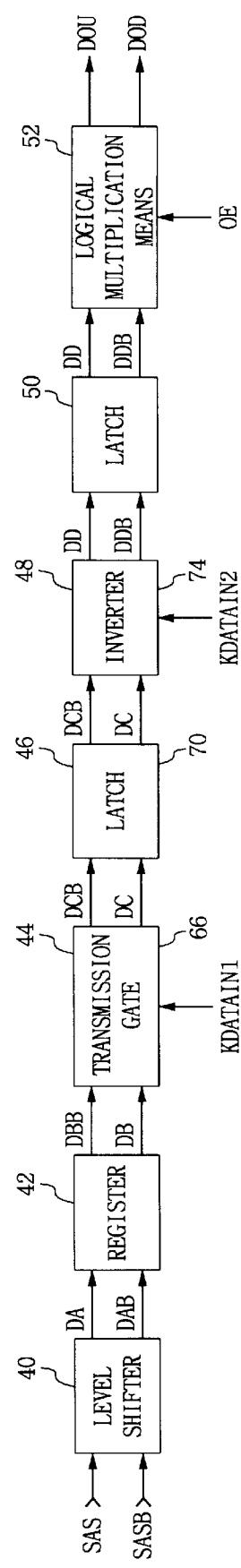
FIG. 5 is a block diagram of an improved data output buffer.
Figure 4A:
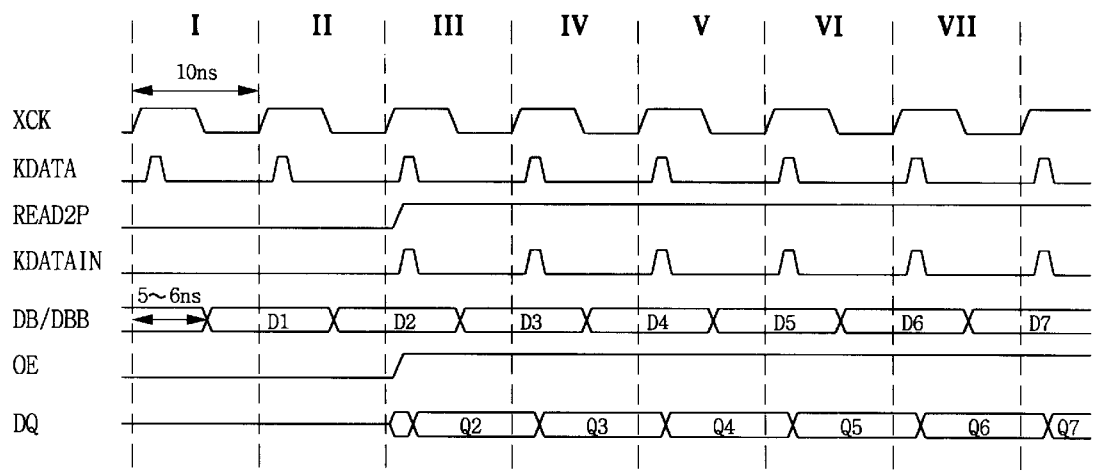
FIG. 4a is a timing diagram of the 2 cycles pipelined operation of the data output buffer shown in FIG. 3a where a frequency clock signal is applied.
Figure 4B:
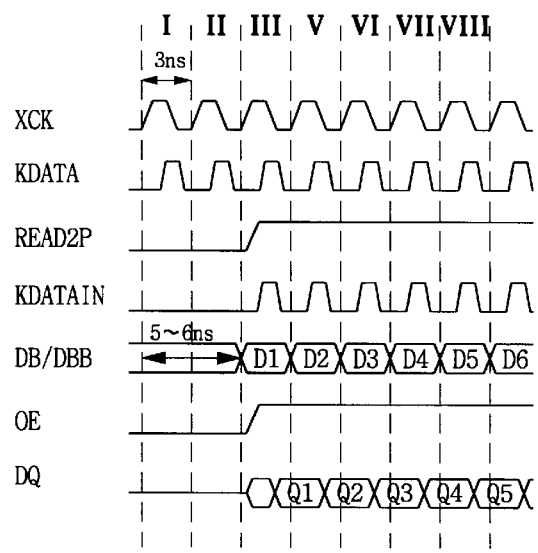
FIG. 4b is a timing diagram of the 2 cycles pipelined operation of the data output buffer shown in FIG. 3a where a high frequency clock signal is applied.
Figure 8:
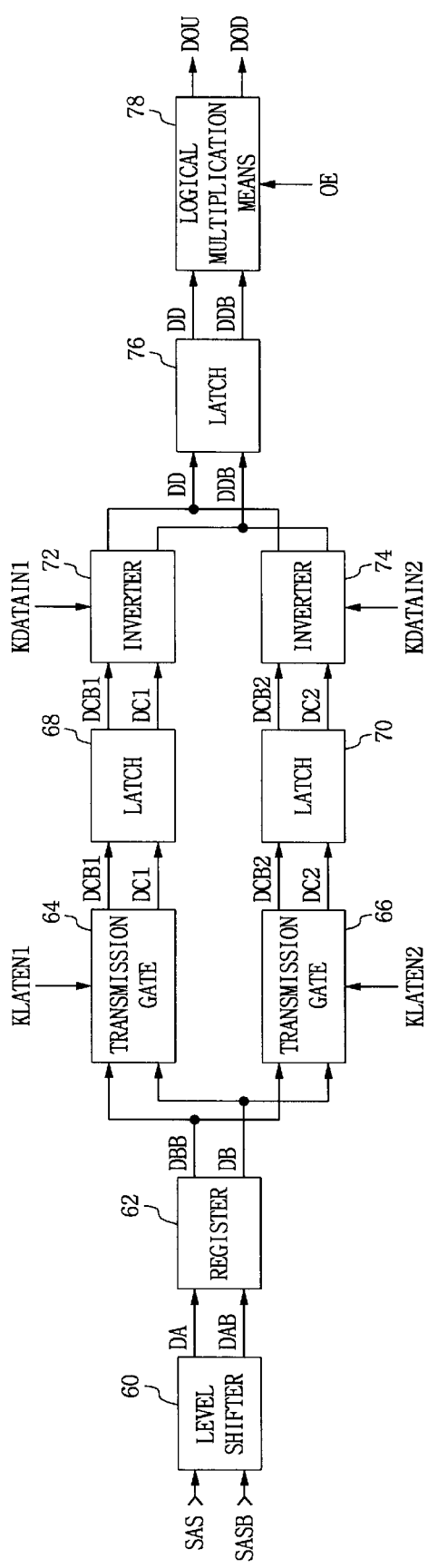
FIG. 8 is a block diagram of the data output buffer according to the present invention.

FIG. 8 is a block diagram of the data output buffer according to the present invention. The data output buffer shown in FIG. 8 comprises a level shifter 60, a register 62, transmission gates 64 and 66, latches 68, 70, and 76, inverters 72 and 74, and logical multiplication means 78. The level shifter 60, the register 62, the latch 76 and the logical multiplication means 78 perform the same function as level shifters 30 and 40, registers 32 and 42, latches 36 and 50, and logical multiplication means 38 and 52 shown and described with reference to FIGS. 2 and 5, respectively.

The transmission gate 64 outputs data output signal pair DBB and DB as data control signal pair DCB1 and DC1 responsive to a control signal KLATEN1. The control signal KLATEN1 is enabled 1 cycle after a read command is received. The latch 68 latches the data output signal pair DCB1 and DC1. The transmission gate 66 outputs data output signal pair DBB and DB as data output signal pair DCB2 and DC2 responsive to a control signal KLATEN2. The control signal KLATEN2 is enabled 2 cycles after a read command is received by the device. The latch 70 latches the data output signal pair DCB2 and DC2. The inverter 72 inverts the data output signal pair DCB1 and DC1 and outputs it as data output signal pair DD and DDB responsive to the first data output control signal KDATAIN1. The inverter 74 inverts the data output signal pair DCB1 and DC1 and outputs it as the data output signal pair DD and DDB responsive to a second data output control signal KDATAIN2. The latch 76 latches the data output signal pair DD and DDB. The logical multiplication means 78 and outputs the data output signal pair DD and DDB as data output signal pair DOU and DOD responsive to a data output enable signal OE.

Figure 6:
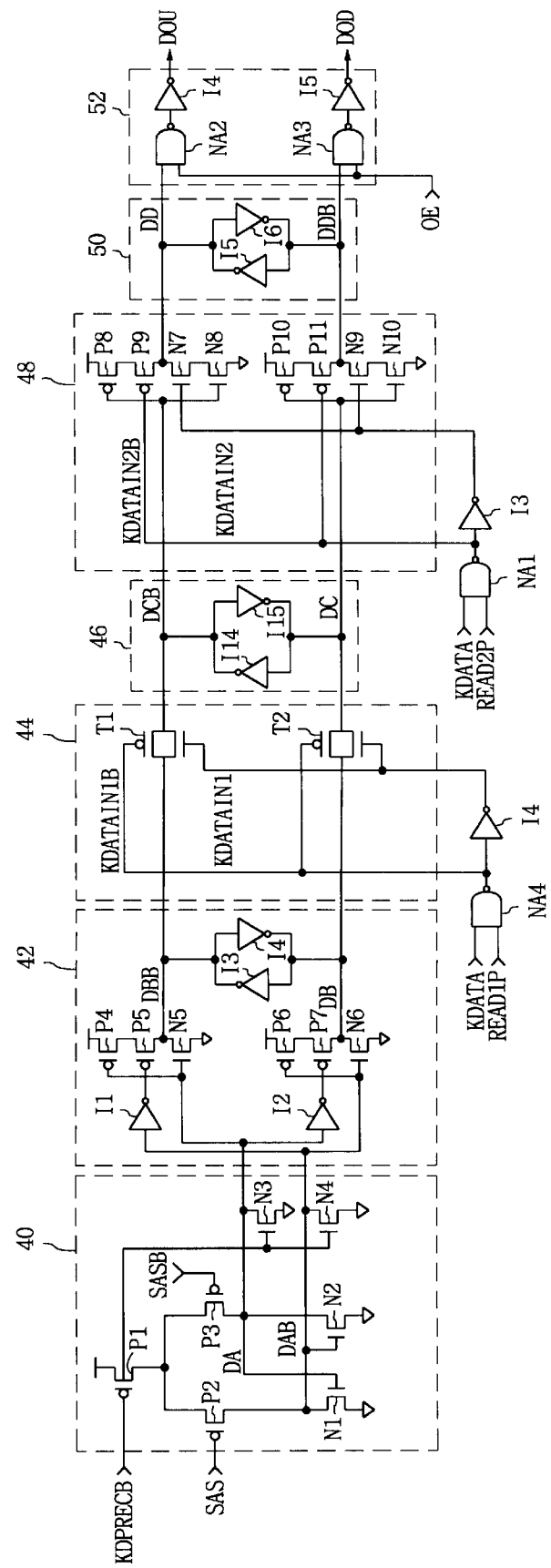
FIG. 6 is a detailed circuit diagram of the data output buffer shown in FIG. 5.
Figure 7A:
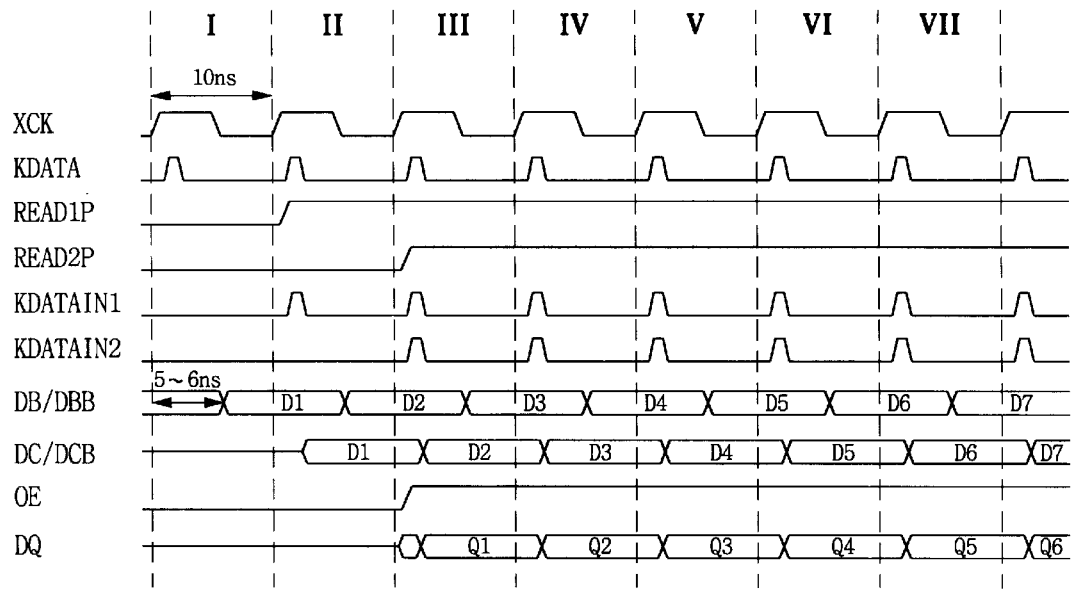
FIG. 7a is a timing diagram of the 2 cycles pipelined operation of the data output buffer shown in FIG. 5 where a low frequency clock signal is applied.
Figure 7B:
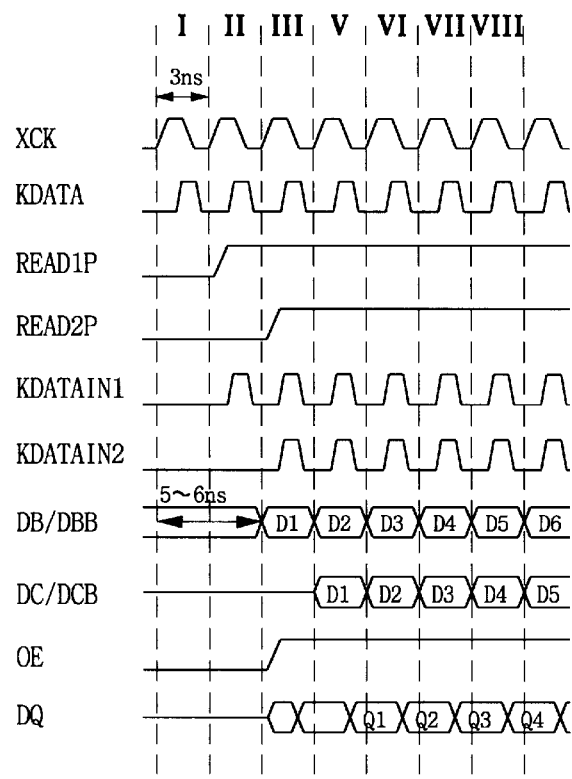
FIG. 7b is a timing diagram of the 2 cycles pipelined operation of the data output buffer shown in FIG. 5 where a high frequency clock signal is applied.
Figure 9:
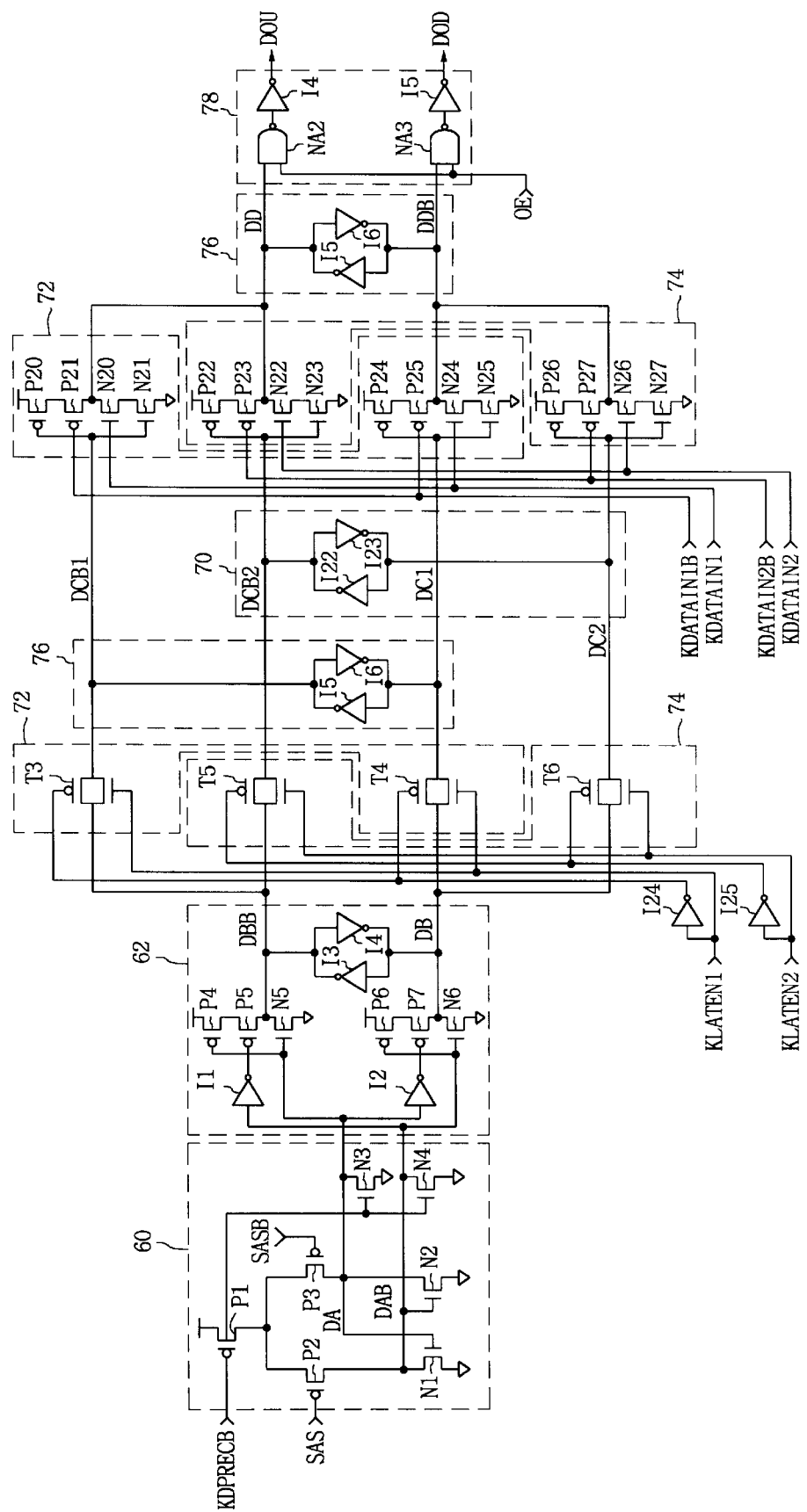
FIG. 9 is a circuit diagram of the data output buffer shown in FIG. 8.

FIG. 9 is a circuit diagram of the data output buffer according to the present invention. The construction of the level shifter 60, the register 62, the latch 76, and the logical multiplication means 78 are the same as analogous blocks shown in FIGS. 3 and 6. The transmission gate 64 comprises CMOS transmission gates T3 and T4. The transmission gate 66 comprises CMOS transmission gates T5 and T6. The latch 68 comprises inverters I20 and I21, and the latch 70 comprises inverters I22 and I23. An inverter 72 comprises PMOS transistors P20, P21, P24, and P25 and NMOS transistors N20, N21, N24, and N25. An inverter 74 comprises PMOS transistors P22, P23, P26, and P27 and NMOS transistors N22, N23, N26, and N27.

The transmission gate 64 the transmission gates T3 and T4 are turned on responsive to a logic high control signal KLATEN1. Then, the data output signal pair DBB and DB is outputted as the data output signal pair DCB1 and DC1. The latch 68 latches the data output signal pair DCB1 and DC1. The transmission gate 66 turns on transmission gates T5 and T6 responsive to a logic high control signal KLATEN2. Then, the data output signal pair DBB and DB is outputted as the data output signal pair DCB2 and DC2. The latch 70 latches the data output signal pair DCB2 and DC2. The inverter 72 turns on the PMOS transistors P21 and P25 and the NMOS transistors N20 and N24 responsive to the first data output control signal KDATAIN1. Then, the data output signal pair DCB1 and DC1 is inverted and outputted as the data output signal pair DD and DDB. The inverter 74 turns on the PMOS transistors P23 and P27 and the NMOS transistors N22 and N26 responsive to the second data output control KDATAIN2. Then, the data output signal pair DCB2 and DC2 is inverted and outputted as the data output signal pair DD and DDB.

Figure 10:
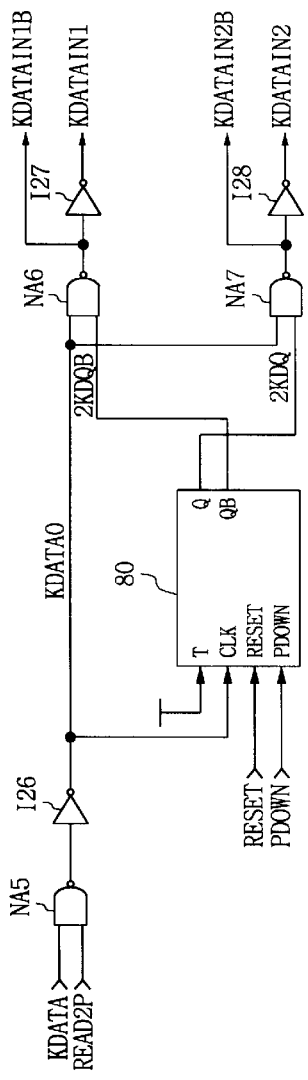
FIG. 10 is a circuit diagram of the control signal generating circuit for generating the control signals KDATAIN1 and KDATAIN2.

FIG. 10 is a circuit diagram of the control signal generating circuit for generating the control signals KDATAIN1 and KDATAIN2. The circuit comprises NAND gates NA5, NA6, and NA7, T-flip-flop 80, and inverters I26, I27, and I28. The NAND gate NA5 and the inverter I26 logically multiply the control signals KDATA and READ2P and generate the signal KDATA0. The T-flip-flop 80 is set responsive to either a reset signal RESET or a power-down signal PDOWN. It also outputs a signal pair 2KDQ and 2KDQB that triggers when a signal KDATA0 changes from a high level to a low level. The NAND gate NA6 logically multiplies the signals KDATA0 and 2KDQB and generates a first inverted data output control signal KDATAIN1B. The inverter I27 inverts the inverted data output control signal KDATAIN1B and generates a first data output control signal KDATAIN1. The NAND gate NA7 logically multiplies the signals KDATA0 and 2KDQB and generates a second inverted data output control signal KDATQAIN2B. The inverter I28 inverts the inverted data output control signal KDATAIN2B and generates a second data output control signal KDATAIN2.

Figure 11:
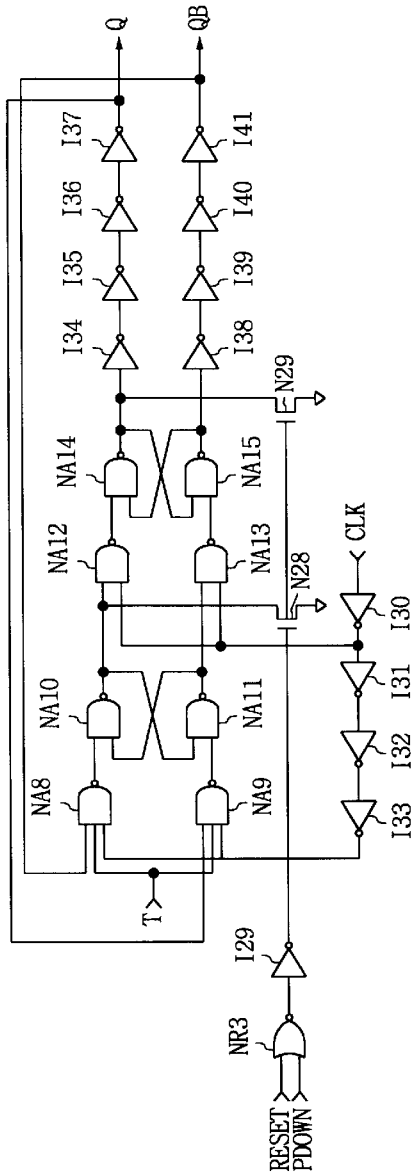
FIG. 11 is a detailed circuit diagram of the T-flip-flop shown in FIG. 10.

FIG. 11 is a detailed circuit diagram of the T-flip-flop 80 shown in FIG. 10. The T-flip-flop 80 comprises a NOR gate NR3, NAND gates NA8, NA9, NA10, NA11, NA12, NA13, NA14, and NA15 and inverters I29, I30, I31, I32, I33, I34, I35, I36, I37, I38, I39, I40, and I41. This circuit has construction of a conventional T-flip-flop that generates an output signal Q that produces an output on the falling edge of the clock signal.

The NOR gate NR3 and the inverter I29 outputs a signal of high level responsive to the reset signal RESET of high level or the power-down signal PDOWN of high level. The NMOS transistors N28 and N29 are turned on to output the signal Q at a low level responsive to an output signal of inverter I29 at a high level.

If the signal is of a high level and the output signal Q is reset at a low level, the T-flip-flop 80 operates in the foling manner. The NAND gates NA8, NA9, NA10, and NA11 function as the main flip-flop and the NAND gates NA12, NA13, NA14, and NA15 function as the sub flip-flop. The main flip-flop functions as a T-flip-flop. If an output signal of the inverter I33 is at a high level, it changes the status of the output signal Q and outputs it to the NAND gate NA10. If the output signal of the inverter I33 is at a low level, the status of the output signal Q is maintained. The sub flip-flop functions as a D-flip-flop. If the output signal of the inverter I30 is at a high level and an output signal of the NAND gate NA10 is at a high level, the output signal Q is at a high level. If the output signal of the NAND gate NA10 is at a low level, the output signal Q is at a low level.

If a clock signal CLK is at a low level, the sub flip-flop produces a low level signal at the output of NAND gate NA1. If the clock signal CLK is at a high level, the main flip-flop changes the output signal Q at a low level, and produces a high level signal at the output of the NAND gate NA10. Conversely, if the clock signal CLK is at a low level, the main flip-flop produces a low level signal at the output of the NAND gate NA10.

Figure 12:
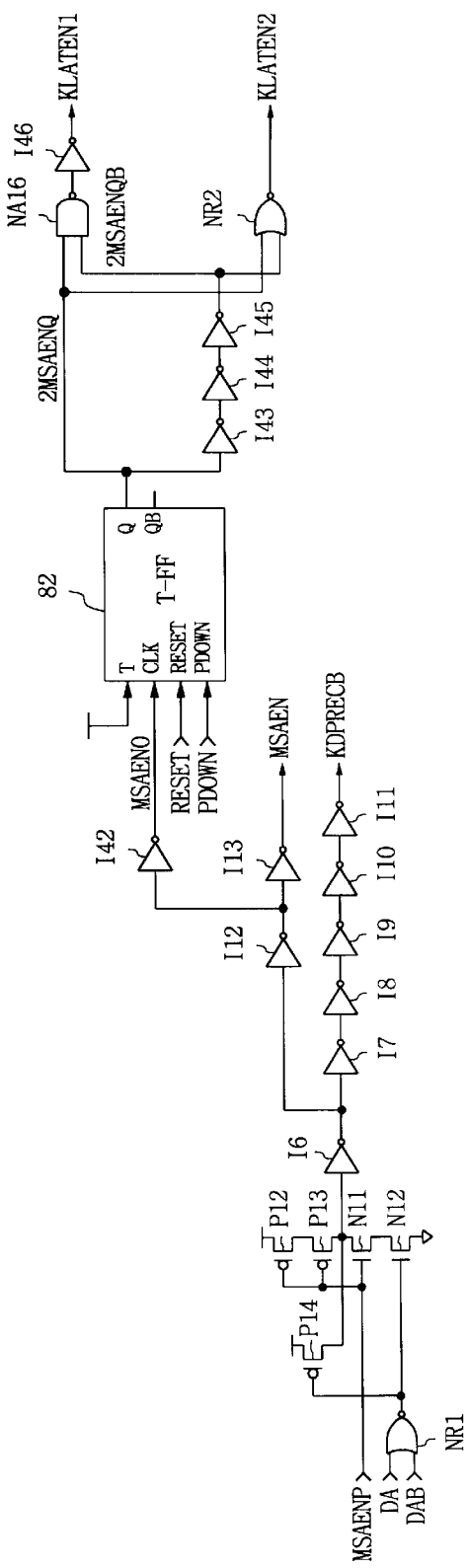
FIG. 12 is a circuit diagram of the control signal generating circuit for generating the control signals KLATEN1 and KLATEN2 and the sense amplifier and the data output buffer enable signal generating circuit.

FIG. 12 shows the circuit for generating the control signals KLATEN1 and KLATEN2, the data output buffer enable signal generating circuit, and the sense amplifier of the present invention. The sense amplifier comprises the NOR gate NR1, the PMOS transistors P12, P13, and P14, the NMOS transistors N11 and N12 and the inverters I6, I7, I8, I9, I10, I11, I12, and I13. The circuit for generating the data output buffer enable signals MSAEN and KDPRECB is the same as that shown in FIG. 3b. The circuit for generating the control signals KLATEN1 and KLATEN2 comprises the inverters I42, I43, I44, I45, and I46, the T-flip-flop 82, the NAND gate NA16, and the NOR gate NR2.

The operation of the circuit for generating the sense amplifier and data output buffer enable signals MSAEN and KDPRECB is the same as that described previously in relation to FIG. 3b. The circuit for generating the control signals KLATEN1 and KLATEN2 operates as follows. The sense amplifier enable signal MSAEN is the positive pulse signal generated during the execution of the read command. An inverter I42 inverts an output signal of an inverter I12 and generates a signal MSAENO. A T-flip-flop 82 is reset and generates an output signal 2MSAENQ responsive to a reset signal RESET or a power-down signal PDOWN. The output signal 2MSAENQ triggers when a high level MSAEN signal changes to a low level. Inverters I43, I44, and I45 invert and delay the signal 2MSAENQ generating a signal 2MSAENQB. A NAND gate NA16 and an inverter I46 logically multiply the signals 2MSAENQ and 2MSAENQB and generate the signal KLATEN1. Similarly, a NOR gate NR2 logically multiplies the signals 2MSAENQ and 2MSAENQB and generates the signal KLATEN2.

Figure 13:
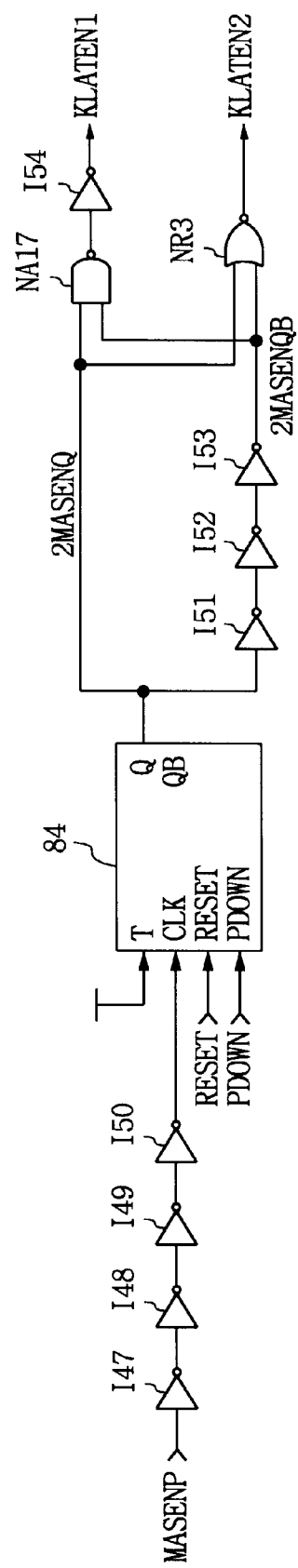
FIG. 13 is a circuit diagram of the control signal generating circuit for generating the control signals KLATEN1 and KLATEN2 according to a second embodiment.

FIG. 13 shows the circuit for generating the control signals KLATEN1 and KLATEN2 according to a second embodiment. The circuit comprises inverters I47, I48, I49, I50, I51, I52, I53, and I54, a T-flip-flop 84, a NAND gate NA17, and a NOR gate NR3. First, the T-flip-flop 84 is reset responsive to the reset signal RESET or the power-down signal PDOWN. The inverters I47, I48, I49, and I50 delay the sense amplifier control signal MSAENP. The T-flip-flop 84 generates the output signal 2MSAENQ responsive to a falling edge of the sense amplifier control signal MSAENP. The inverters I51, I52, and I53 invert and delay the signal 2MSAENQ and generate the signal 2MSAENQB. The NAND gate NA17 and the inverter I54 logically multiply the signals 2MSAENQ and 2MSAENQPB thereby generating the signal KLATEN1. The NOR gate NR3 logically multiplies the signals 2MSAENQ and 2MSAENQPB thereby generating the signal KLATEN2.

Figure 14A:
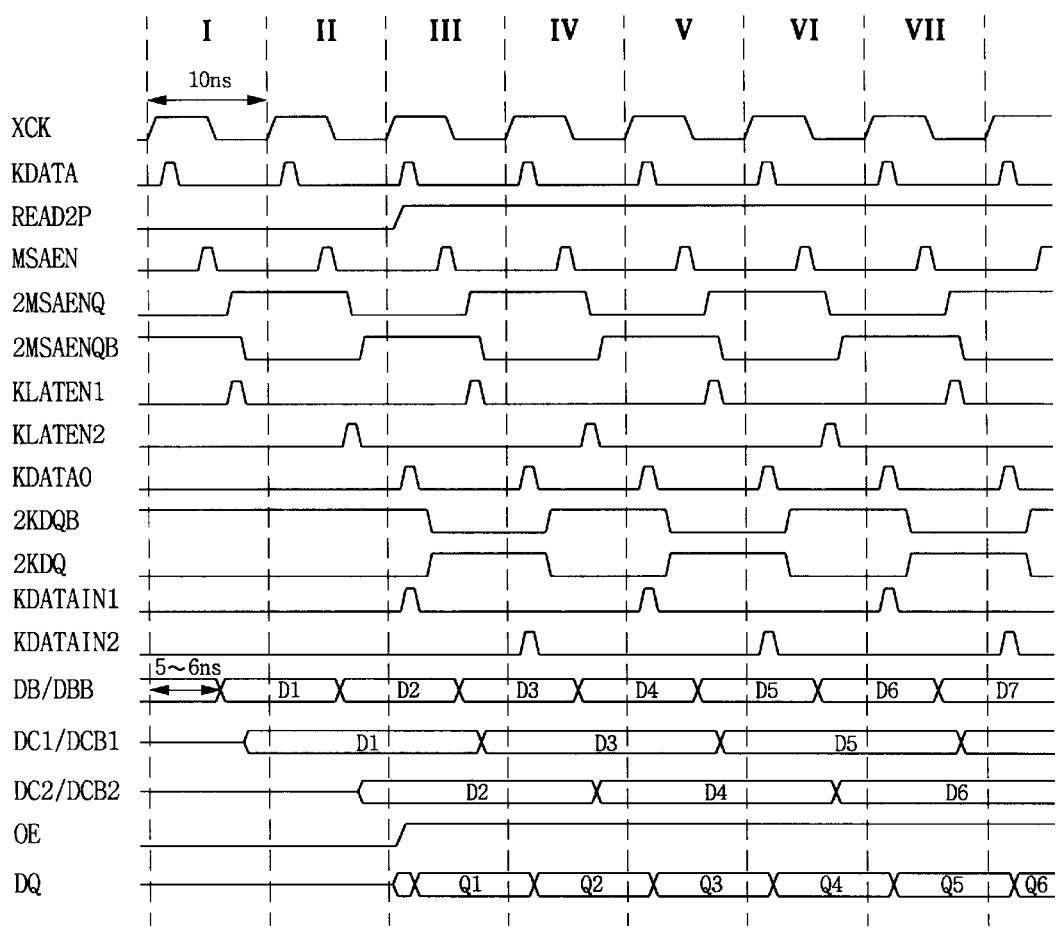
FIG. 14a is a timing diagram of the 2 cycles pipelined operation of the data output buffer shown in FIG. 9 where a low frequency clock signal is applied.

FIG. 14a is a timing diagram of the 2 cycles pipelined operation of the data output buffer shown in FIG. 9 where a frequency clock signal is applied. In FIG. 14a, the cycle time of the clock signal is approximately 10ns. Of these, 5–6ns (this is almost a fixed amount of time) is needed to read data to be latched into the latch of the register 62 after the read command is received.

The control signal KDATA is enabled responsive to the clock signal XCK during the execution of the read command. The control signal READ2P is enabled, as described above, after 2 cycles of the read command. In the timing diagram shown in FIG. 14a, the read command is continuously received, and the control signal READ2P is always enabled from the third cycle III. The sense amplifier enable signal MSAEN is enabled during the execution of the read command by the sense amplifier enable signal generating circuit shown in FIG. 12. The signal 2MSAENQ is triggered responsive to the falling edge of the sense amplifier enable signal MSAEN. The signal 2MSAENQB is inverted and delayed thereby generating the signal 2MSAENQB. The control signal KLATEN1 is generated when the signals 2MSAENQ and 2MSAENQB are logically multiplied. The control signal KLATEN1 is generated in the second, fourth and sixth cycles II, IV, VI, respectively. In other words, the control signals KLATEN1 and KLATEN2 are generated in turn, based on the unit of a cycle. The control signal KDATAO is generated when the signals KDATA and READ2P are logically multiplied. The control signal KDATAO is generated by being synchronized by the signal KDATA from the third cycle III. The signal 2KDQ is triggered responsive to the falling edge of the control signal KDATAO. The signal 2KDQB is an inverted version of the signal 2KDQ. The first data output control signal KDATAIN1 is generated when the signals KDATAO and 2KDQ are logically multiplied. The second data output control signal KDATAIN2 is generated when the signals KDATAO and 2KDQB are logically multiplied. The first data output control signal KDATAIN1 is generated in the third, fifth and sixth cycles III, V, VII, respectively, and the second data output control signal KDATAIN2 is generated in the fourth and sixth cycles IV and VI, respectively. In other words, the first and second data output control signals are generated in turn, based on the unit of a cycle.

In the first cycle I, the read data D1 pertinent to the first read command is latched in the register 62 of the data output buffer after approximately 5–6ns have lasped (hereinafter a predetermined time). Then, the read data D1 is latched in the latch 68 through the transmission gate 64 responsive to the control signal KLATEN1. In the second cycle II, the read data D2 pertinent to the second read command is latched in the register 62 of the data output buffer after lapse of the predetermined time. The read data D2 is latched in the register 70 through the transmission gate 66 responsive to the control signal KLATEN1. Then, the read data D1 is latched in the latch 68.

In the third cycle III, the read command D3 pertinent to the third read command is latched in the register 62 of the data output buffer after lapse of the predetermined time. The read data D1 is latched in the latch 76 through the inverter 72 responsive to the first data output control signal KDATAIN1. The read data D1 is then provided to external circuitry as output data Q1 responsive to the data output enable signal OE through the logical multiplication means 78. Then, the read data D3 previously latched into the register 62 is latched in the latch 68 through the transmission gate 64 responsive to the control signal KLATEN1. The read data D2 is latched in the latch 70. In the fourth cycle, the read data D4 pertinent to the fourth read command is latched in the register 62 of the data output buffer after lapse of the predetermined time. The read data D4 (now in latch 70) is latched in the latch 70 is latched in the latch 76 through the inverter 74 responsive to the first data output control signal KDATAIN2. The read data is then provided to external circuitry as output data through the logical multiplication means 78 responsive to the data ouput enable signal OE. Then, the read data D4 is latched in the latch 70 through the transmission gate 66 responsive to the control signal KLATEN2. The read data D3 is latched in the latch 68. Thus, the 2 cycles pipelined operation are performed without error in a continuous read cycle where a low-frequency clock signal is applied to the data output buffer shown in FIG. 9.

Figure 14B:
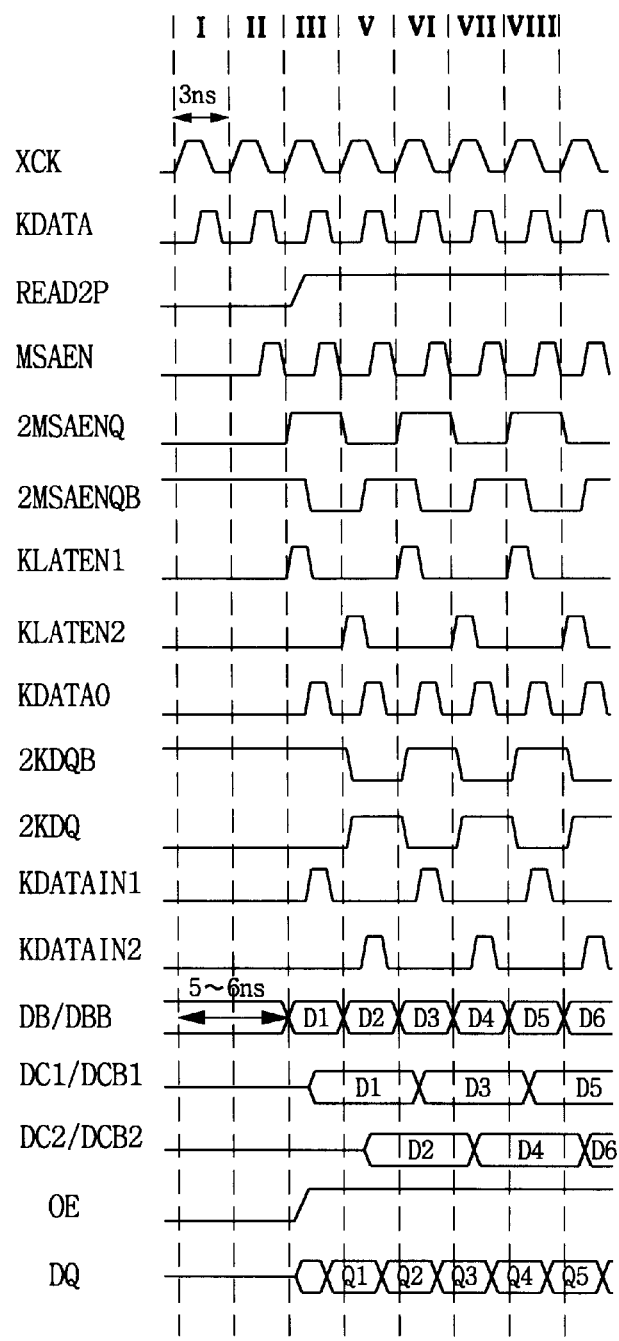
FIG. 14b is a timing diagram of the 2 cycles pipelined operation of the data output buffer shown in FIG. 9 where a high frequency clock signal is applied.

FIG. 14b is a timing diagram of the 2 cycles pipelined operation of the data output buffer shown in FIG. 9 where a high-frequency clock signal is applied. In FIG. 14b, the cycle time of the clock signal is approximately 3ns. It takes 5–6ns (this is almost a fixed amount of time) for the read data to be latched in the latch of the register 62 after the read command is continuously received. The generation of the control signals is explained above with reference to FIG. 14a. The sense amplifier enable signal in FIG. 14b is not enabled in the first cycle because it takes a certain amount of time to generate the sense amplifier enable signal after the read command is received.

In the first cycle I, the read data D1 corresponding to the first read command is read. In the second cycle II, the read data D2 corresponding to the read command is read and the read data D1 is provided to the data output buffer. In the third cycle III, the read data D3 corresponding to the third read command is read. At this time, the read data D1 is latched in the register 42 of the data output buffer. The read data D1 is latched in the latch 68 through the transmission gate 64 responsive to the control signal KLATENN1. The first read data D1 is latched in the latch 76 through the inverter 72, responsive to the first data output control signal KDATA1. The test read data D1 is then provided to external circuitry as output data Q1 through the logical multiplication means 78 responsive to the output enable signal OE. The read data D2 is provided to the data output buffer. The data stored in the latch 68 is the read data D1.

In the fourth cycle IV, the read data D4 corresponding to the fourth read command is read and the read data D2 is latched in the register 62 of the data output buffer. The read data D2 is latched in the latch 70 through the transmission gate 66 responsive to the control signal KLATEN2. The read data D2 that is latched in the latch 70 is outputted as the output data Q2 responsive to the second data output control signal KDATAIN2. The read data D3 is provided to the data output buffer. The read data stored in latches 68 and 70 is the read data D1 and D2, respectively. Thus, the 2 cycles pipelined operation is performed without error in a continuous read cycle where a high frequency clock signal is applied to the data output buffer shown in FIG. 9. In other words, the data output buffer of the present invention can correctly perform the 2 cycles pipelined operation when the clock signal has either a low frequency or a high frequency.

The 2 cycles pipelined read operation of the present invention generates the signals KLATEN1 and KLATEN2 responsive to the read command. The read data is stored in the latches 68 and 70, in turn, responsive to the signals KLATEN1 and KLATEN2. Doing so prevents data loss.

Figure 15:
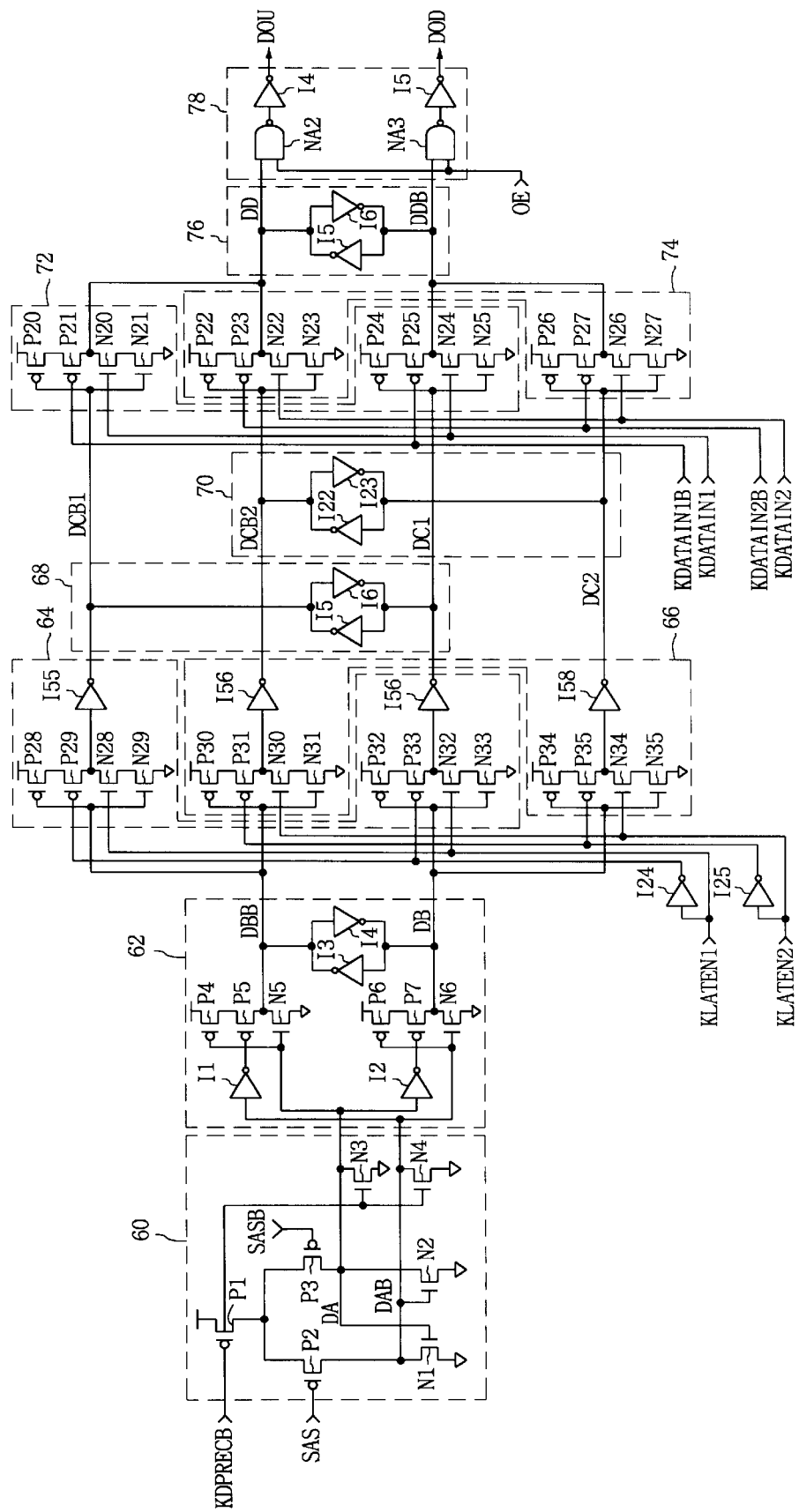
FIG. 15 is a circuit diagram of the data output buffer according to a second embodiment of the present invention.

FIG. 15 is a circuit of a second embodiment of the data output buffer of the present invention. The data output buffer shown in FIG. 15 uses the clocked CMOS inverter for the transmission gates 64 and 66. In FIG. 15, the transmission gate 64 comprises PMOS transistors P28, P29, P32 and P33, NMOS transistors N28, N29, N32 and N33 and inverters I55 and I57. The transmission gate 66 comprises of PMOS transistors P30, P31, P34 and P35, NMOS transistors N30, N31, N34 and N35 and inverters I56 and I58. The transmission gate 64 turns on the NMOS transistors N28, N32 and the PMOS transistors P29, P33 responsive to a "high" signal KLATEN1. Then, the data output signal pair DBB and DB is inverted. The inverters I55 and I57 invert the signal provided to the drain of the NMOS transistors N28 and N32 and outputs the data output signal pair DCB1 and DC1. In other words, the transmission data 64 transmits the data output signal pair DBB and DB as the data output signal pair DCB1 and DC1.

The transmission gate 66 turns on the NMOS transistors N30 and N34 and the PMOS transistors P31 and P35 responsive to a "high" level control signal KLATEN2. Then, the data output signal pair DBB and DB is inverted. The inverters I55 and I57 invert the signal provided to the drain of the NMOS transistors N30 and N34 and output it as the data output signal pair DCB2 and DC2. In other words, the transmission gate 66 transmits the data output signal pair DBB and DB as the data output signal pair DCB2 and DC2 responsive to the signal KLATEN2. The transmission gates 64 and 66 used with the clocked CMOS inverter shown in FIG. 15 performs the same operation as the transmission gates used with the CMOS transmission gate shown in FIG. 9.

Having illustrated and described the principles of my invention in a preferred embodiment thereof, it should be readily apparent to those skilled in the art that the invention can be modified in arrangement and detail without departing from such principles. We claim all modifications coming within the spirit of the accompanying claims.

What is claimed is:

1. A semiconductor memory device, comprising:

a memory cell array;

a sense amplifier coupled to the memory array for generating a sense output signal pair by amplifying a data line signal pair from the memory cell array responsive to a sense amplifier enable signal; and a data output buffer coupled to the sense amplifier for buffering the sense output signal pair;

wherein the data output buffer includes:

a level shifter for generating a first data output signal pair by shifting a voltage level of the sense output signal pair responsive to a data output buffer enable signal;

a register for generating a second data output signal pair by inverting and latching the first data output signal pair;

a first transmission and latch means for generating a third data output signal pair by transmitting and latching the second data output signal pair responsive to a first control signal;

a second transmission and latch means for generating a fourth data output signal pair by latching the second data output signal pair responsive to a second control signal;

a first inverter circuit for generating a fifth data output signal pair by inverting the third data output signal pair responsive to a first data output control signal;

a second inverter circuit for generating the fifth data output signal pair by inverting the fourth data output signal pair responsive to a second data output control signal;

a first latch for generating the sixth data output signal pair by latching the fifth data output signal pair; and a logical multiplication means for logically manipulating the sixth data output signal responsive to an output enable signal.

2. The semiconductor memory device of claim 1 including a data output buffer enable signal generating circuit for generating the output buffer enable signal, the data output buffer enable signal generating circuit comprising:

a pull-up circuit for pulling up a first internal signal responsive to a sense amplifier enable pulse and the first data output signal pair;

a pull-down circuit for pulling down the first internal signal responsive to the sense amplifier enable pulse and the first data output signal pair;

a first inverter for inverting the first internal signal; and a first delay circuit for generating the data output buffer enable signal by delaying the inverted internal enable signal.

3. The semiconductor memory device of claim 2 wherein the data output buffer enable signal generating circuit generates the sense amplifier enable signal, the data output buffer enable signal generating circuit including:

a second delay circuit for delaying the inverted first internal signal; and a second inverter for generating the sense amplifier enable signal by inverting the delayed and inverted first internal signal.

4. The semiconductor memory device of claim 1 including a control signal generating circuit for generating the first and second control signals, including:

a t-flip-flop for generating a first internal signal responsive to an inverted version of the sense amplifier enable signal;

an inverter circuit for generating a second internal signal by delaying and inverting the first internal signal; and a logic circuit for generating the first and second control signals by logically manipulating the first and second internal signals.

5. The semiconductor memory device of claim 4 wherein the logic circuit includes:

a NAND gate for generating the first control signal by NANDing the first internal signal to the second internal signal; and a NOR gate for generating the second control signal by NORing the first internal signal to the second internal signal.

6. The semiconductor memory device of claim 4 wherein the t-flip-flop resets responsive to a reset signal or a power down signal.

7. The semiconductor memory device of claim 1 including a data output control signal generating circuit for generating the first and second data output control signals, including:

a first logic circuit for generating a first data signal by logically manipulating a 2-cycle read signal and a second data signal, the 2-cycle read signal being enabled 2 cycles after a read command is received by the semiconductor memory device and the second data signal being synchronized with a clock signal;

a t-flip-flop coupled to the first logic circuit for generating a first and a second flip-flop signals responsive to the first data signal, the first flip-flop signal being an inverted version of the second flip-flop signal; and a second logic circuit coupled to the first logic circuit and the t-flip-flop for generating the first data output control signal by logically manipulating the first data signal and the first flip-flop signal and the second data output control signal by logically manipulating the first data signal and the second flip flop signal.

8. The semiconductor memory device of claim 7 wherein the t-flip-flop resets responsive to a reset signal or a power down signal.

9. The semiconductor memory device of claim 1 wherein the first transmission and latch means includes:

a first transmission gate for transmitting a first signal of the second data output signal pair responsive to the first control signal;

a second transmission gate for transmitting a second signal of the second data output signal pair responsive to the first control signal; and a second latch coupled between the first and second transmission gates for latching the transmitted first and second signals of the second data output signal pair.

10. The semiconductor memory device of claim 9 wherein the first latch includes a first and a second inverter, the first inverter having an input terminal connected to an output terminal of the second inverter and an output terminal connected to an input terminal of the first inverter.

11. The semiconductor memory device of claim 1 wherein the first transmission and latch means includes:

a first CMOS circuit for inverting and transmitting a first signal of the second data output signal pair;

a second CMOS circuit for inverting and transmitting a second signal of the second data output signal pair, the first signal of the second data output signal pair being an inverted version of the second signal of the second data output signal pair; and a second latch connected between the first and second CMOS circuits for latching the transmitted first and second signals of the second data output signal pair.

12. The semiconductor memory device of claim 11 wherein the first CMOS circuit includes:

a first PMOS transistor having a source, a drain, and a gate terminal, the source terminal receiving a power supply and the gate terminal receiving the first signal of the second data output signal pair;

a second PMOS transistor having a source, a drain, and a gate terminal, the source terminal being connected to the drain terminal of the first PMOS transistor and the gate terminal receiving an inverted first control signal;

a first NMOS transistor having a source, a drain, and a gate terminal, the source terminal being connected to the drain terminal of the second PMOS transistor and the gate terminal receiving the first control signal;

a second NMOS transistor having a source, a drain, and a gate terminal, the source terminal being connected to the drain terminal of the first NMOS transistor, the drain terminal receiving a ground, and the gate terminal receiving the first signal of the second data output signal pair; and a first inverter having an input and an output terminal, the input terminal being connected to the source of the first NMOS transistor and the output terminal being connected to the second latch.

13. The semiconductor memory device of claim 12 wherein the second CMOS circuit includes:

a third PMOS transistor having a source, a drain, and a gate terminal, the source terminal receiving a power supply and the gate terminal receiving the second signal of the second data output signal pair;

a fourth PMOS transistor having a source, a drain, and a gate terminal, the source terminal being connected to the drain terminal of the third PMOS transistor and the gate terminal receiving the inverted first control signal;

a third NMOS transistor having a source, a drain, and a gate terminal, the source terminal being connected to the drain terminal of the fourth PMOS transistor and the gate terminal receiving the first control signal;

a fourth NMOS transistor having a source, a drain, and a gate terminal, the source terminal being connected to the drain terminal of the third NMOS transistor, the drain terminal receiving a ground, and the gate terminal receiving the second signal of the second data output signal pair; and a second inverter having an input and an output terminal, the input terminal being connected to the source of the third NMOS transistor and the output terminal being connected to the second latch.

14. The semiconductor memory device of claim 11 wherein the second transmission and latch means includes:

a third CMOS circuit for inverting and transmitting the first signal of the second data output signal pair;

a fourth CMOS circuit for inverting and transmitting the second signal of the second data output signal pair; and a third latch connected between the third and fourth CMOS circuits for latching the transmitted first and second signals of the second data output signal pair.

15. The semiconductor memory device of claim 14 wherein the third CMOS circuit includes:

a first PMOS transistor having a source, a drain, and a gate terminal, the source terminal receiving a power supply and the gate terminal receiving the first signal of the second data output signal pair;

a second PMOS transistor having a source, a drain, and a gate terminal, the source terminal being connected to the drain terminal of the first PMOS transistor and the gate terminal receiving an inverted second control signal;

a first NMOS transistor having a source, a drain, and a gate terminal, the source terminal being connected to the drain terminal of the second PMOS transistor and the gate terminal receiving the second control signal;

a second NMOS transistor having a source, a drain, and a gate terminal, the source terminal being connected to the drain terminal of the first NMOS transistor, the drain terminal receiving a ground, and the gate terminal receiving the first signal of the second data output signal pair; and a first inverter having an input and an output terminal, the input terminal being connected to the source of the first NMOS transistor and the output terminal being connected to the third latch.

16. The semiconductor memory device of claim 15 wherein the fourth CMOS circuit includes:

a third PMOS transistor having a source, a drain, and a gate terminal, the source terminal receiving a power supply and the gate terminal receiving the second signal of the second data output signal pair;

a fourth PMOS transistor having a source, a drain, and a gate terminal, the source terminal being connected to the drain terminal of the third PMOS transistor and the gate terminal receiving the inverted second control signal;

a third NMOS transistor having a source, a drain, and a gate terminal, the source terminal being connected to the drain terminal of the fourth PMOS transistor and the gate terminal receiving the second control signal;

a fourth NMOS transistor having a source, a drain, and a gate terminal, the source terminal being connected to the drain terminal of the third NMOS transistor, the drain terminal receiving a ground, and the gate terminal receiving the second signal of the second data output signal pair; and a second inverter having an input and an output terminal, the input terminal being connected to the source of the third NMOS transistor and the output terminal being connected to the second latch.

17. The semiconductor memory device of claim 14 wherein the first inverter circuit includes:

a first CMOS inverter for inverting a first signal of the third data output signal pair responsive to an inverted version of the first data output control signal; and a second CMOS inverter for inverting a second signal of the third data output signal pair responsive to the first data output control signal.

18. The semiconductor memory device of claim 17 wherein the second inverter circuit includes:

a third CMOS inverter for inverting a first signal of the fourth data output signal pair responsive to an inverted version of the second data output control signal; and a second CMOS inverter for inverting a second signal of the fourth data output signal pair responsive to the second data output control signal.

19. A data output buffer for a semiconductor memory device, semiconductor memory device having a cell array and a sense amplifier for generating a sense amplifier output pair signal by amplifying a read data line pair responsive to a sense amplifier enable signal, the data output buffer comprising:

a level shifting means for generating a first data output signal pair by shifting a level of the sense amplifier output pair signal responsive to a data output buffer enable signal; a storage means for generating a second data output signal pair by storing the first data output signal pair;

a first transmission means for generating a third data output signal pair by transmitting the second data output signal pair responsive to a first control signal;

a second transmission means for generating a fourth data output signal pair by transmitting the second data output signal pair responsive to a second control signal; and a selecting means for generating a fifth data output signal pair by transmitting either the third data output signal pair responsive to a first data output control signal or the fourth data output signal pair responsive to a second data output control signal.

20. The data output buffer of claim 19 including a data output means for providing the fifth data output signal pair to external circuitry responsive to an output enable signal.

21. The data output buffer of claim 19 including a control signal generating circuit for generating the first and second control signals, comprising:

a flip-flop for receiving a version of the sense amplifier enable signal and generating a flip-flop output signal; and a logic circuit coupled to the flip-flop for generating the first and second control signals responsive to the flip-flop output signal.

22. The data output buffer of claim 21 wherein the logic circuit includes:

a group of serially connected inverters for inverting and delaying the flip-flop output signal;

a first logic gate for logically manipulating the flip-flop output signal with the inverted and delayed version of the flip-flop signal to generate the first control signal; and a second logic gate for logically manipulating the flip-flop output signal with the inverted and delayed version of the flip-flop signal to generate the second control signal.

23. The data output buffer of claim 22 wherein the first logic gate is a NAND gate, the second logic gate is a NOR gate, and the flip-flop is a t-flip-flop.

24. The data output buffer of claim 19 including a data output control signal generating means for generating the first and second data output control signals, comprising:

a first logic circuit for logically manipulating a 2-cycle read signal and a data signal, the 2-cycle read signal being enabled 2 cycles after a read command is received and the data signal being synchronized with a clock signal;

a flip-flop for generating a flip-flop output signal and an inverted flip-flop output signal responsive to an output signal of the first logic circuit;

a second logic circuit for generating the first data output control signal by logically manipulating the output signal of the first logic circuit and the inverted flip-flop output signal; and a third logic circuit for generating the second data output control signal by logically manipulating the output signal of the first logic circuit and the flip-flop output signal.

25. The data output buffer of claim 24 wherein the first, second, and third logic circuits includes a NAND gate and wherein the flip-flop is a t-flip-flop.

26. The data output buffer of claim 24 wherein the t-flip-flop is reset responsive to a reset signal or a power down signal.

27. A method for reading data from a semiconductor memory device having a memory cell array, a sense amplifier for generating a sense output signal pair by amplifying a data read signal pair responsive to a sense amplifier enable signal, and a data output buffer for buffering the sense output signal pair, the method comprising:

generating a first data output signal pair by shifting a level of the sense amplifier output pair signal responsive to a data output buffer enable signal;

generating a second data output signal pair by storing the first data output signal pair;

generating a third data output signal pair by transmitting the second data output signal pair responsive to a first control signal;

generating a fourth data output signal pair by transmitting the second data output signal pair responsive to a second control signal; and generating a fifth data output signal pair by transmitting either the third data output signal pair responsive to a first data output control signal or the fourth data output signal pair responsive to a second data output control signal.

28. The method of claim 27 including providing the fifth data output signal pair to external circuitry responsive to an output enable signal.

29. The method of claim 27 including generating the first and second control signals, comprising:

receiving a version of the sense amplifier enable signal at a flip-flop and generating a flip-flop output signal; and logically manipulating the flip-flop output signal to generate the first and second control signals.

30. The method of claim 27 wherein logically manipulating the flip-flop output signal includes:

inverting and delaying the flip-flop output signal using a group of serially connected inverters;

NANDing the flip-flop output signal with the inverted and delayed version of the flip-flop signal to generate the first control signal; and NORing the flip-flop output signal with the inverted and delayed version of the flip-flop signal to generate the second control signal.

31. The data output buffer of claim 27 including generating the first and second data output control signals, comprising:

generating a logic signal by logically manipulating a 2-cycle read signal and a data signal, the 2-cycle read signal being enabled 2 cycles after a read command is received and the data signal being synchronized with a clock signal;

generating a flip-flop output signal and an inverted flip-flop output signal using a flip-flop responsive to the logic signal;

generating the first data output control signal by logically manipulating the logic signal and the inverted flip-flop output signal; and a third logic circuit for generating the second data output control signal by logically manipulating the logic signal and the flip-flop output signal.

32. The method of claim 31 wherein generating the first data output control signal includes NANDing the logic signal and the inverted flip-flop output signal and wherein generating the second data output control signal includes NANDing the logic signal and the flip-flop output signal.

33. The method of claim 32 including resetting the flip-flop responsive to a reset or a power down signal.

* * * * *

UNITED STATES PATENT AND TRADEMARK OFFICE
CERTIFICATE OF CORRECTION

PATENT NO. : 6,160,742
DATED : December 12, 2000
INVENTOR(S) : Chung et al.

Page 1 of 1

It is certified that error appears in the above-identified patent and that said Letters Patent is hereby corrected as shown below:

Title page,
"OF DEVICE" should read -- THEREOF --.

Column 2,
Line 27, "gate NAI" should read -- gate NA1 --.
Line 42, "has a lower er voltage" should read -- has a lower voltage --.

Column 6,
Line 20, "to be used from be as" should read -- to be used from --.

Column 10,
Line 15, "inverter 128" should read -- inverter I28 --.
Line 49, "gate NA1." should read -- gate NA10. --.

Column 12,
Line 8, "third, fifth and sixth" should read -- third, fifth and seventh --.
Line 14, "have lasped" should read -- have lapsed --.

Column 13,
Line 4, "KLATENN1" should read -- KLATEN1 --.

Signed and Sealed this

Ninth Day of April, 2002

Attest:

*Attesting Officer*

JAMES E. ROGAN
*Director of the United States Patent and Trademark Office*